(12) United States Patent
Fisher et al.

(10) Patent No.: US 6,954,681 B2
(45) Date of Patent: Oct. 11, 2005

(54) BOARD ALIGN IMAGE ACQUISITION DEVICE WITH IMPROVED INTERFACE

(75) Inventors: Lance K. Fisher, Excelsior, MN (US); John D. Gaida, Victoria, MN (US); Joseph L. Horijon, Veldhoven (NL); Todd D. Liberty, Apple Valley, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 10/745,860

(22) Filed: Dec. 24, 2003

(65) Prior Publication Data

US 2004/0254681 A1 Dec. 16, 2004

Related U.S. Application Data

(63) Continuation of application No. 10/017,501, filed on Dec. 14, 2001, now abandoned.
(60) Provisional application No. 60/255,925, filed on Dec. 15, 2000.

(51) Int. Cl.[7] .......................... G05B 15/00; G05B 19/00
(52) U.S. Cl. ...................... 700/259; 700/245; 700/254; 219/121.85; 219/124.34; 348/94; 348/95; 356/237.1; 356/243.1; 345/156; 345/157; 362/247; 250/559.45
(58) Field of Search ................................ 700/245, 254, 700/259; 219/121.85, 124.34; 348/94, 95; 356/237.1, 243.1; 345/156, 157; 362/247; 250/559.45; 313/113

(56) References Cited

U.S. PATENT DOCUMENTS

| | | | |
|---|---|---|---|
| 4,146,924 A | 3/1979 | Birk et al. .................. 364/513 |
| 4,628,464 A | 12/1986 | McConnell ................. 364/513 |
| 4,731,923 A | 3/1988 | Yagi et al. .................... 29/833 |
| 4,831,549 A | 5/1989 | Red et al. .................... 364/513 |
| 4,970,365 A | 11/1990 | Chalco .................. 219/121.63 |
| 5,040,291 A | 8/1991 | Janisiwecz et al. ........... 29/840 |
| 5,075,079 A | 12/1991 | Kerr et al. ..................... 422/64 |
| 5,140,730 A | 8/1992 | Maskens et al. ........... 29/33 M |
| 5,148,591 A | 9/1992 | Pryor .......................... 29/407 |
| 5,237,622 A | 8/1993 | Howell ....................... 382/151 |
| 5,247,844 A | 9/1993 | Howell ...................... 73/865.8 |
| 5,297,238 A | 3/1994 | Wang et al. .................. 395/94 |
| 5,387,969 A | 2/1995 | Marantette ................. 356/4.09 |
| 5,396,331 A | 3/1995 | Kitoh et al. ................ 356/376 |
| 5,502,890 A | 4/1996 | Gunter ........................ 29/833 |
| 5,526,050 A | 6/1996 | King et al. ................. 348/387 |

(Continued)

FOREIGN PATENT DOCUMENTS

| | | |
|---|---|---|
| DE | 42 22 283 | 8/1993 |
| DE | 43 39 715 | 4/1995 |
| DE | 41 19 401 | 7/1998 |
| EP | 0 222 072 | 5/1987 |
| EP | 0 330 294 | 8/1989 |
| EP | 0 374 848 | 6/1990 |
| EP | 0 471 272 | 2/1992 |
| EP | 0 606 083 | 7/1994 |

(Continued)

OTHER PUBLICATIONS

HPFIT, Hight Precision Fitting, Sep. 1997, Internet, pp. 1–15.*

(Continued)

Primary Examiner—Thomas G. Black
Assistant Examiner—McDieunel Marc
(74) Attorney, Agent, or Firm—Westman, Champlin & Kelly, P.A.

(57) ABSTRACT

An electronics assembly system includes an image acquisition system that is coupled to a controller through an improved interface. The coupling facilitates advanced monitoring and control of the image acquisition system. Multiple image acquisition systems can be coupled to the controller over the same interface.

11 Claims, 4 Drawing Sheets

U.S. PATENT DOCUMENTS

| | | | | |
|---|---|---|---|---|
| 5,537,204 | A | | 7/1996 | Woodhouse ............ 356/243.1 |
| 5,577,130 | A | | 11/1996 | Wu ............................ 382/106 |
| 5,694,483 | A | | 12/1997 | Onoguchi .................... 382/154 |
| 5,732,150 | A | * | 3/1998 | Zhou et al. ................. 382/133 |
| 5,781,447 | A | | 7/1998 | Gerdes ......................... 716/15 |
| 5,861,910 | A | * | 1/1999 | McGarry et al. ............. 348/87 |
| 5,897,611 | A | | 4/1999 | Case et al. .................. 702/150 |
| 5,905,850 | A | | 5/1999 | Kaveh .......................... 395/94 |
| 5,982,416 | A | | 11/1999 | Ishii et al. .................... 348/29 |
| 5,991,434 | A | | 11/1999 | St. Onge .................... 382/146 |
| 6,016,599 | A | | 1/2000 | Morita et al. ................. 29/833 |
| 6,079,098 | A | | 6/2000 | Soellner et al. ............... 29/832 |
| 6,144,366 | A | * | 11/2000 | Numazaki et al. .......... 345/156 |
| 6,282,462 | B1 | | 8/2001 | Hopkins ..................... 700/259 |
| 6,288,780 | B1 | | 9/2001 | Fairley et al. ........... 356/237.1 |
| 6,392,688 | B1 | | 5/2002 | Barman et al. ............... 348/42 |
| 6,430,474 | B1 | * | 8/2002 | DiStasio et al. ............ 700/245 |
| 6,554,452 | B1 | * | 4/2003 | Bourn et al. ................ 362/247 |
| 6,606,540 | B1 | * | 8/2003 | Gross .......................... 700/258 |
| 6,681,151 | B1 | * | 1/2004 | Weinzimmer et al. ...... 700/259 |
| 6,704,619 | B1 | * | 3/2004 | Coleman et al. ............ 700/245 |
| 2002/0062170 | A1 | | 5/2002 | Skunes et al. .............. 700/229 |
| 2002/0107613 | A1 | | 8/2002 | Hopkins ..................... 700/269 |
| 2002/0173876 | A1 | * | 11/2002 | Fisher et al. ................ 700/245 |
| 2002/0181233 | A1 | | 12/2002 | Adler et al. ................. 362/247 |
| 2003/0029003 | A1 | | 2/2003 | Hidese et al. ................. 29/833 |

FOREIGN PATENT DOCUMENTS

| | | |
|---|---|---|
| EP | 0 650 319 | 4/1995 |
| EP | 0 767 357 | 4/1997 |
| EP | 0 772 381 | 5/1997 |
| JP | 0620287108 | 12/1987 |
| JP | 0630075503 | 4/1988 |
| JP | 0630157041 | 6/1988 |
| JP | 0040042599 | 2/1992 |
| JP | 0040106939 | 4/1992 |
| JP | 0040307950 | 10/1992 |
| JP | 0050138466 | 6/1993 |
| JP | 0070243810 | 9/1995 |
| JP | 0090210618 | 8/1997 |
| WO | WO 96/12395 | 4/1996 |
| WO | WO 96/12396 | 4/1996 |
| WO | WO 98/08367 | 2/1998 |
| WO | WO 98/24291 | 6/1998 |
| WO | WO 98/32318 | 7/1998 |
| WO | WO 02/102128 A1 | 12/2002 |

OTHER PUBLICATIONS

"1394–Based Digital Camera Specification," 1394 Trade Association The Multimedia Connection, Version 1.20, pp. 1–35 (Jul. 23, 1998).

Hoffman, Gar, "IEEE 1394, The A/V Digital Interface of Choice," 1394 Trade Association The Multimedia Connection, downloaded from http://www.1394ta.org/Technology/About/digital_av.htm, 4 pages (Nov. 15, 2001).

"IIDC 1394–Based Digital Camera Specification," 1394 Trade Association The Multimedia Connection, Version 1.30, pp. 1–46 (Jul., 25, 2000).

"IEEE–1394 Digital Camera," Dragonfly Point Grey Research, 11 pages, downloaded from www.ptgrey.com (dated Aug. 19, 2002).

Yeasin et al., Toward automatic robot programming: Learning human skill from visual data, 2000, pp. 180–185.

Payandeh et al., A control architecture for arm/hand manipulating system, 1991, IEEE, pp. 1440–1443.

Beckett et al., An automated pick–place laser soldering process for electronics assembly, 1994, IEEE, pp. 1079–1081.

Eppes et al., A meteorological study of the small displacement behavior of a SCARA type pick and place robot, 1998, IEEE, pp. 219–223.

Yong et al, Robot task execution with telepresence using virtual reality technology, 1998, Internet, pp. 1–8.

ABB, Picking and packing robots, 2002, Internet, pp. 1–12.

Schroeder Machines Robotic System, Robotic systems: Flexible packaging automation solutions, 1997, Internet, pp. 1–3.

Naksuk, The implementation of a natural admittance controller on an industrial robot, 2000, Internet, pp. i–74.

Lee et al., A dynamic programming approach to reel assignment problem of a surface mounting machine in printed circuit board assembly, 1998, IEEE, pp. 227–232.

Newman et al., Design lessons for building agile manufacturing systems, 2000, IEEE, pp. 228–328.

Perfect's pages, Engineering projects: Robotic arm (Phase IV), 2000, Internet, pp. 1–5.

Langley et al., Pose estimation for fixtureless assembly using a feature CMAC neural network, 2000, Internet, pp. 356–361.

Wohlke, A simulation–based grasp planning system for multifinger robot hand, 1983, IEEE, pp. 219–224.

* cited by examiner

BOARD ALIGN IMAGE ACQUISITION DEVICE WITH IMPROVED INTERFACE

CROSS REFERENCE TO RELATED APPLICATION

This application is a continuation application of Ser. No. 10/017,501, filed Dec. 14, 2001 now abandoned, which this application is base on and claims the benefit of U.S. provisional patent application Ser. No. 60/255,925, filed Dec. 15, 2000, entitled "CAMERA WITH IEEE 1394 INTERFACE."

BACKGROUND OF THE INVENTION

The electronics assembly industry uses machines such as pick and place machines to automatically pick components from component feeders and place the components upon circuit boards during board assembly. Subsequently, the components themselves are permanently attached to the circuit board at locations where the pick and place machine has deposited them. Due the relatively high speed required for such operations as well as the extremely small-scale of the components themselves, component placement and alignment are extremely important. In order to facilitate advances in component placement and alignment, optical systems and associated processors have advanced accordingly. One common element of a pick and place system is known as the board align image acquisition device. Typically, this image acquisition device resides upon a placement head and is used to essentially image a reference position (also known as a fiducial) on the board. By determining the placement of the head via encoders, or other suitable position measuring means, associated therewith, and determining the position of the fiducial from the image supplied by the board align camera, the relative position of the placement head with respect to the board is precisely known.

The position of the component to be placed on the placement head is calculated in a similar manner but with a generally upward-looking component align (CA) image acquisition device. The component align image acquisition device generally acquires an image of the component to be placed after it has been picked up by the placement head. The host processor then determines the position of the component on the placement head and knowing the position of the placement head with respect to the board, so manipulates the component to be placed that it is oriented correctly and placed properly upon the board. Thus, a typical pick and place system includes a pair of image acquisition device (board align and component align). Due to the relatively high-speed operation of pick and place machines, there is a relatively large amount of data (both image data and control data) that passes between the host processor and the various image acquisition devices and their associated illuminators. A pick and place system that could accommodate the relatively high data transfer burdens while simultaneously simplifying wiring and reducing costs would be a significant increase in the art. Moreover, if such system could provide data transfer rate head room beyond that which is currently needed and accommodate future scalability, system implementation would be facilitated.

SUMMARY OF THE INVENTION

An electronics assembly system includes an image acquisition system that is coupled to a controller through an improved interface. The coupling facilitates advanced monitoring and control of the image acquisition system. Multiple image acquisition devices can be coupled to the controller over the same interface.

DETAILED DESCRIPTION OF THE PREFERRED EMBODIMENTS

Figure 1:
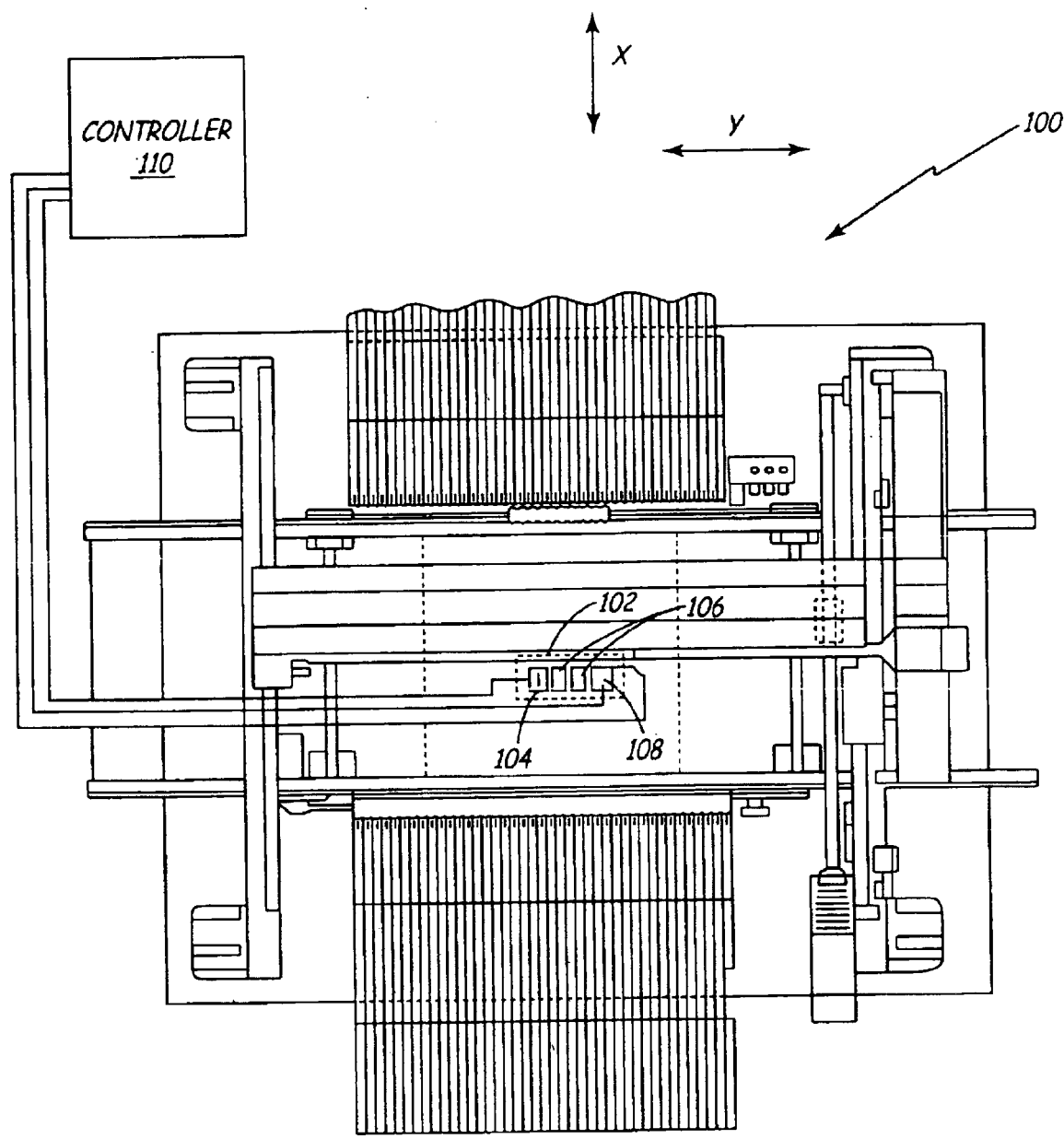
FIG. 1 is a diagrammatic view of a known pick and place machine in which embodiments of the present invention are particularly useful.

FIG. 1 is a diagrammatic view of a pick and place machine 100 in accordance with the prior art. Machine 100 includes placement head 102 upon which are mounted component align (CA) image acquisition device 104, nozzles 106 and board align (BA) image acquisition device 108. Controller 110 is coupled to devices 104 and 108 as well as encoders operably coupled to placement head 102 which encoders indicate position of placement head 102 along X and Y axes.

Figure 2:
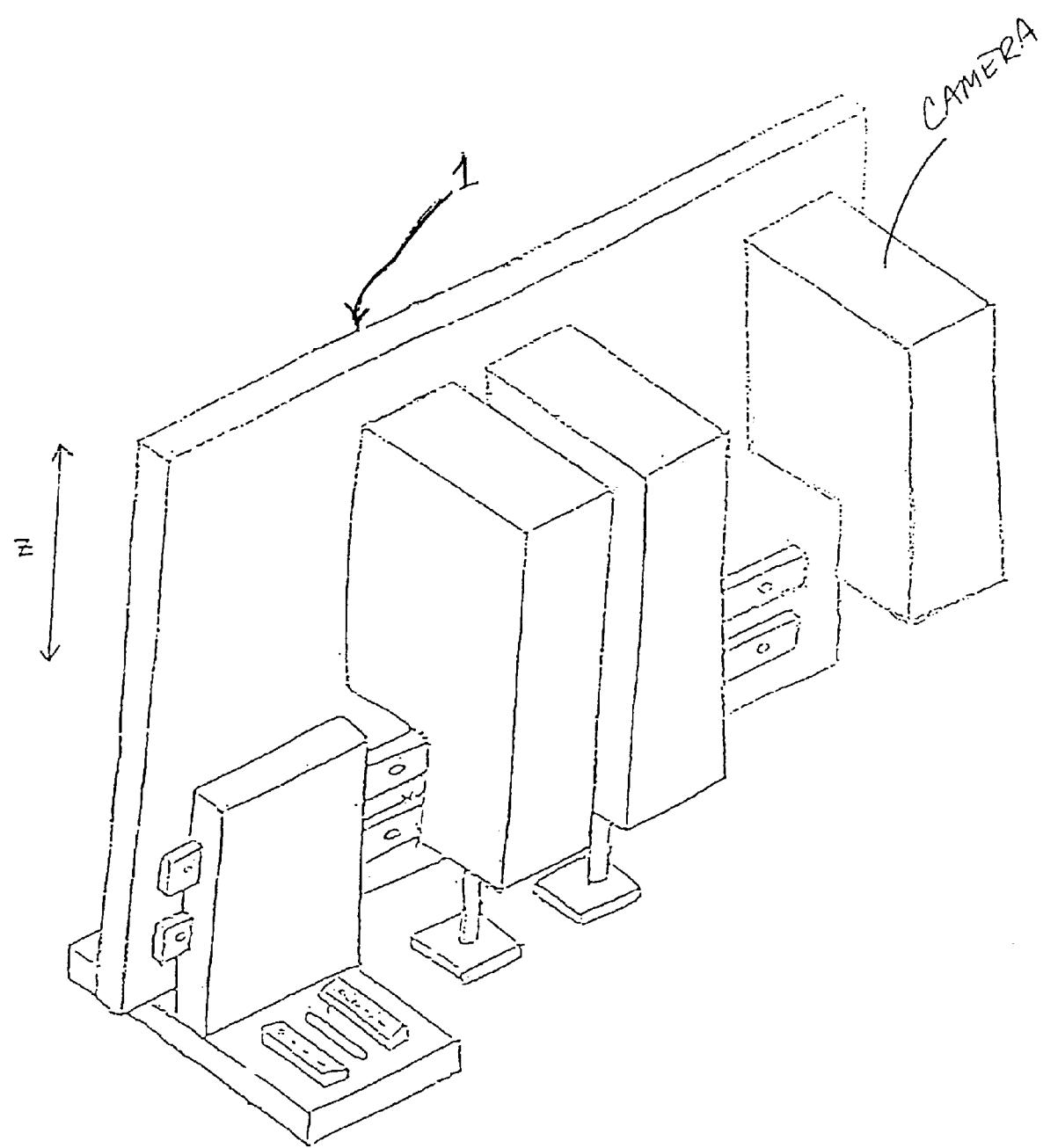
FIG. 2 is a perspective view of a placement head including a board align image acquisition device in accordance with an embodiment of the present invention.

FIG. 2 is a perspective view of placement head 102. As illustrated, placement head 102 includes a pair of pick and place units 112 each of pick and place units 112 include a nozzle 106 that is adapted to releasably couple a component to be placed such as components 114. Pick and place units 112 are adapted to displace components 114 along the Z axis to place components 114 upon a circuit board (not shown). While components 114 are releasably held by nozzles 106, relative motion between the nozzles 106 and the component align image acquisition device 104 is translated beneath components 114 while imaging components 114 with device 104 allows for determination of the relative orientations of components 114 with respect to the nozzles 106. FIG. 2 also illustrates board align (BA) image acquisition device 108 disposed proximate an edge of placement head 102 and facing downward. Device 108 acquires an image of a reference position marker (fiducial) on the circuit board in order to allow calculation of the placement head 102 position with respect to the circuit board.

Figure 3:
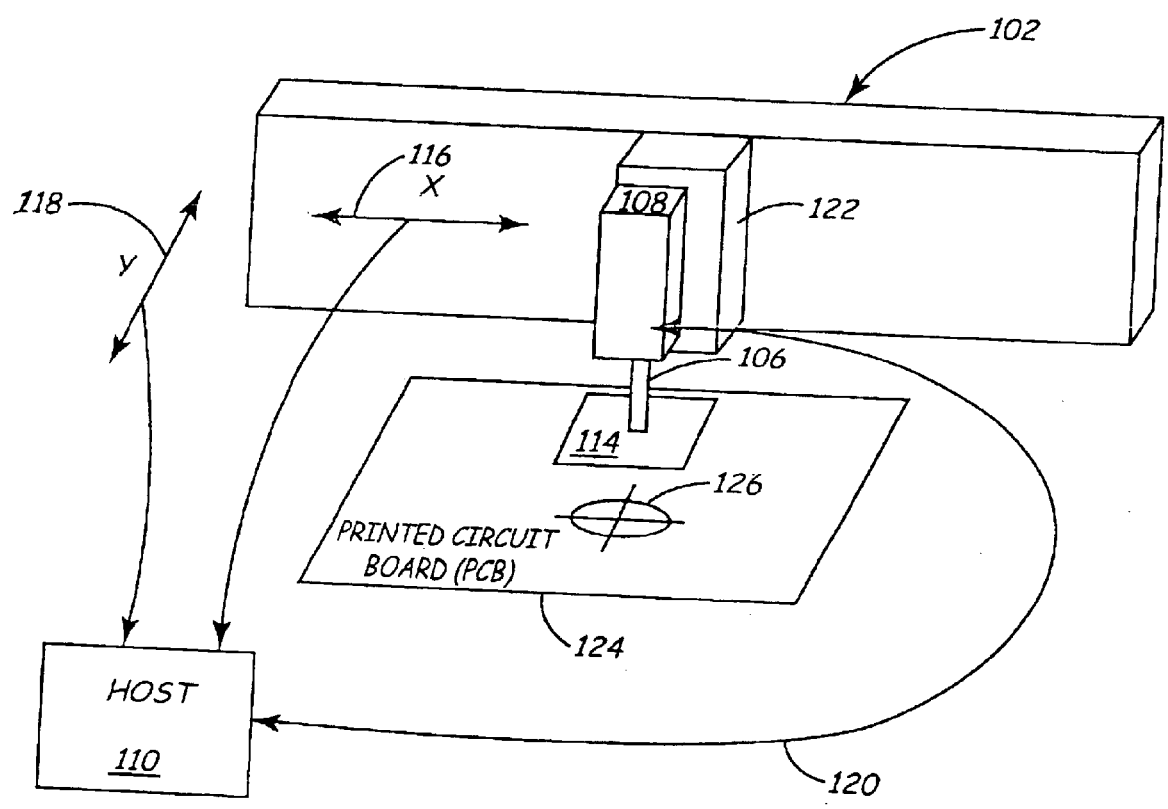
FIG. 3 is a diagrammatic view of a portion of a pick and place machine in accordance with an embodiment of the present invention.

FIG. 3 is a diagrammatic view of a portion of a pick and place machine in accordance with an embodiment of the present invention. Host 110 is coupled to X and Y encoders (illustrated diagrammatically at reference numerals 116 and 118, respectively). Additionally, host 110 is coupled to board align image acquisition device 108 via interface 120. Device 108 is also physically coupled to robot 122 which is used to actuate nozzle 106 to pick up components 114 and place them upon printed circuit board (PCB) 124. As illustrated, board 124 includes a reference position mark, or fiducial, 126. When required, board align image acquisition device 108 acquires an image of fiducial 126, and/or additional fiducials, and computes a position of placement head 102 with respect to board 124. While not shown in FIG. 3, a component align image acquisition device is also used to acquire images of the components themselves to calculate component orientation and position such that the components can be accurately placed upon board 124. Further, board align image acquisition device 108 and component align image acquisition device 104 typically have associated lighting. Thus, a significant amount of data overhead is created wherein image data from device 108 and/or device 104 must be transmitted to host controller 110. One aspect of embodiments of the present invention is placing one or more of the image acquisition devices (board align, component align, or other suitable devices) upon a bus that accommodates such co-existence without significantly increasing complexity or cost.

One example of such a bus is known as the IEEE 1394 Standard for High Performance Serial Bus the standards of which are published by the Institute of Electrical and Electronics Engineers Inc. Information about the IEEE 1394 serial bus standard may be found on the world wide web. The IEEE 1394 standard provides for data transmission speeds at 100, 200, 400 megabits per second and beyond over the serial bus. The format and type of information to be sent between the host and the digital camera over the IEEE 1394 serial bus adheres to the 1394 Trade Association's 1394-based Digital Camera Specification, Version 1.3, dated Jul. 25, 2000. As used herein "Specification" shall include any specification compatible, either presently or backwardly, with the IEEE 1394-based Digital Camera Specification. While the Specification listed above does not provide features which facilitate the use in pick and place machines, there is an ability provided in the Specification to add additional features. This is done via advanced control and status registers (CSR). A portion of this patent document will make reference to the Specification. Information regarding the Specification may be found on the worldwide web. Some of the features useful for device 108 but not currently set forth in the Specification follow. The Specification does not set forth an ability to control four or more illumination channels. In additional to the control of illumination, there are currently no characterization registers available to determine the capabilities of each image acquisition device. Another feature that is not provided by the Specification is the ability to set illumination counters to help determine lifetime of the illuminators themselves. Further, there is currently no storage provided by the Specification for mechanical and optical parameters that could be characterized during calibration. These features and their implementation in embodiments of the present invention will be set forth in greater detail below.

Figure 4:
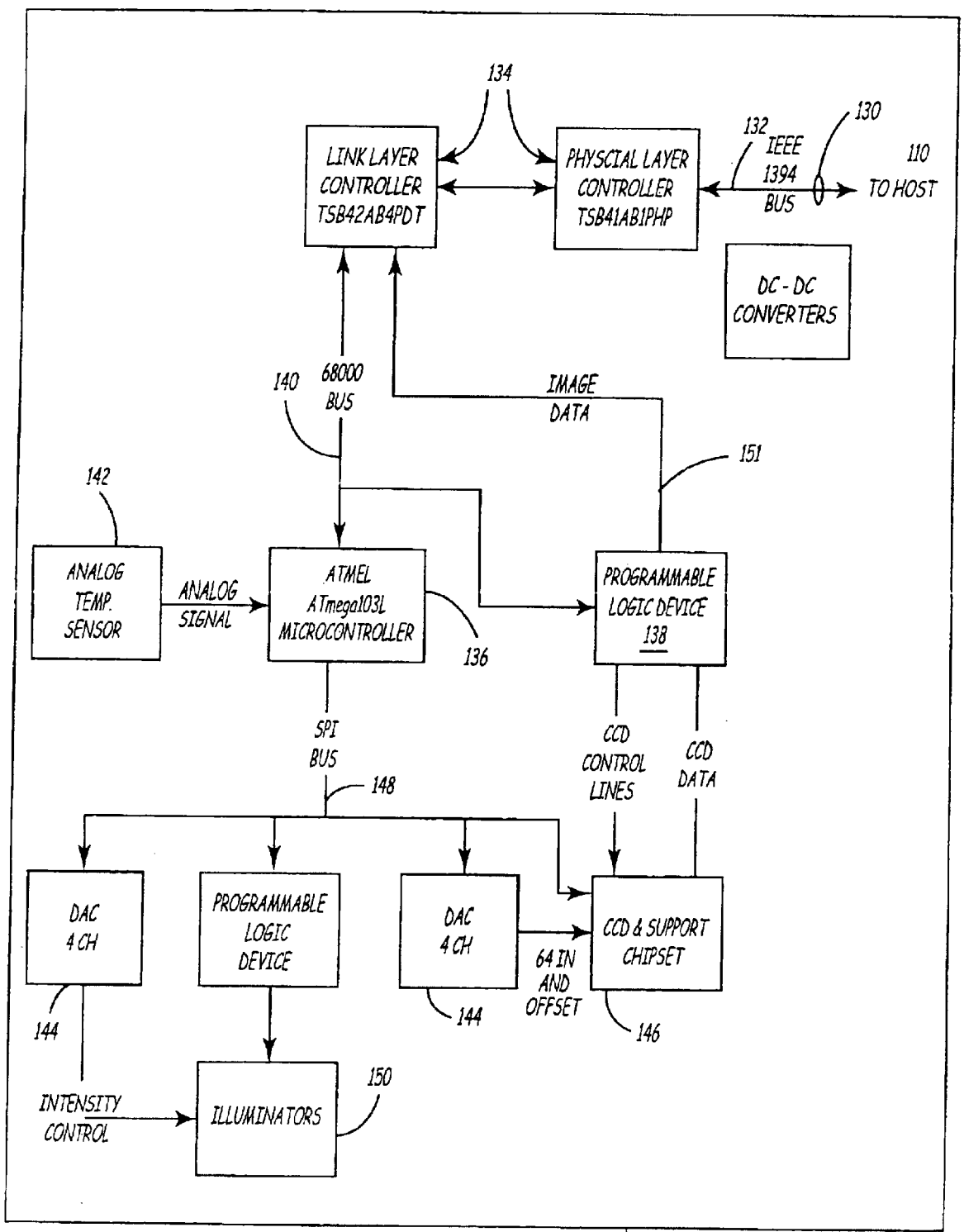
FIG. 4 is a system block diagram of an image acquisition system in accordance with an embodiment of the present invention.

FIG. 4 is a diagrammatic view of BA image acquisition device 108 in accordance with an embodiment of the present invention. Device 108 couples to host 110 through port 130 along Specification bus 132. Bus 132 is coupled to link and physical layer controller 134. Preferably, link and physical layer controllers are preferably commercially available devices sold by Texas Instruments under the trade designations TSB42AB4PDT, and TSB41AB1PHP, respectively. Controller 134 is coupled to microcontroller 136 and programmable logic device 138 through bus 140. Preferably, bus 140 is a 16-bit 68000 bus. Microcontroller 136 is preferably a microcontroller sold under the trade designation Atmega103L available from Atmel of San Jose, Calif. Microcontroller 136 is also coupled to analog temperature sensor 142, four-channel digital-to-analog converter 144 and CCD and support chip set 146. Preferably, microcontroller 136 is coupled to converter 144 and chip set 146 through a serial peripheral interface bus 148. Through programmable logic device 138 and image data bus 151, CCD the support chip set 146 can acquire and provide an image to IEEE 1394 controller 134. During acquisition of such an image, illuminators 150 are engaged in response to control signals from microcontroller 136 and/or programmable logic device 138. Illuminators 150 can include a darkfield illuminator, and/or brightfield illuminator. One of the primary features of adapting device 108 for operation with IEEE 1394 bus 132 is that additional image acquisition devices and IEEE 1394 bus-compatible devices can be coupled to the same bus. This reduces system wiring and complexity while also facilitating standardization and implementation.

The following description sets forth a preferred embodiment in such detail that specific data values for specific control and status registers in the 1394 specification are provided.

| | | Basic Function Inquiry Register | | | |
|---|---|---|---|---|---|
| Offset | Name | Field | Bit | Value | Description |
| 400 (Read Only) | BASIC FUNC_INQ | Memory Channel | (31 . . . 28) | 0 | Maximum memory channel number |
| | | | (27 . . . 21) | 0 | Reserved |
| | | Multi_shot_Inq | 20 | 0 | No Multi shot transmission capable |
| | | One-shot-Inq | 19 | 1 | One shot transmission capable |
| | | | (18 . . . 17) | 0 | Reserved |
| | | Cam_Power_Cntl | 16 | 0 | There is no camera process power ON/OFF capability |
| | | | (15 . . . 1) | 0 | Reserved |
| | | Advanced_Feature_Inq | 0 | 1 | Indicates presence of advanced failure. |

Feature Presence Inquiry Registers
Feature Hi Inquiry

| Offset | Name | Field | Bit | Value | Description |
|---|---|---|---|---|---|
| 404 (Read Only) | FEATURE_HI_INQ | | (31 ... 13) | 0 | Reserved |
| | | Trigger | 12 | 1 | Trigger control |
| | | Temperature | 11 | 1 | Temperature read-only |
| | | Focus | 10 | 0 | No Focus control |
| | | Iris | 9 | 0 | No Iris control |
| | | Gain | 8 | 1 | Gain control |
| | | Shutter | 7 | 1 | Shutter speed control |
| | | Gamma | 6 | 0 | No Gamma control |
| | | Saturation | 5 | 0 | No Saturation control |
| | | Hue | 4 | 0 | No Hue control |
| | | White Balance | 3 | 0 | No White balance control |
| | | Sharpness | 2 | 0 | No Sharpness Control |
| | | Auto Exposure | 1 | 0 | No Auto Exposure Control |
| | | Brightness | 0 | 1 | Brightness Control Capable |

Feature Lo Inquiry

| Offset | Name | Field | Bit | Value | Description |
|---|---|---|---|---|---|
| 408 (Read Only) | FEATURE_LO_INQ | Zoom | 0 | 0 | No Zoom Control |
| | | Pan | 1 | 0 | No Pan control |
| | | Tilt | 2 | 0 | No Tilt control |
| | | Optical filter | 3 | 0 | No Optical filter control |
| | | | (4 ... 15) | 0 | Reserved |
| | | Capture_Size | 16 | 0 | N/A (Capturing image size for format 6) |
| | | Capture_Quality | 17 | 0 | N/A (Capture image quality for Format 6) |
| | | | (18 ... 31) | 0 | Reserved |

Advanced Feature CSR Offset

| Offset | Name | Field | Bit | Value | Description |
|---|---|---|---|---|---|
| 480 (Read Only) | ADVANCED_FEATURE_INQ | Advanced Feature_Quadlet_Offset | (0 ... 31) | 3FC 0000 | CSR quadlet offset for Advanced Feature CSR. This offset is from the initial register space of FFFF F000 0000. This will put the base of the advanced feature CSR at FFF FFF0 0000. |

Feature Elements Inquiry Registers
Brightness Inquiry

| Offset | Name | Field | Bit | Value | Description |
|---|---|---|---|---|---|
| 500 (Read only) | BRIGHTNESS_INQ | Presence_Inq | 0 | 1 | Presence of this feature |
| | | | (1 ... 2) | 0 | Reserved |
| | | One_Push_Inq | 3 | 0 | One push auto mode (Controlled automatically by camera only once) |
| | | Read/Out_Inq | 4 | 1 | Capability of reading the value |

-continued

Feature Elements Inquiry Registers
Brightness Inquiry

| Offset | Name | Field | Bit | Value | Description |
|---|---|---|---|---|---|
| | | | | | of this feature |
| | | On/Off_Inq | 5 | 0 | Capability of switching this feature ON and OFF |
| | | Auto_Inq | 6 | 0 | Auto mode (controlled by camera) |
| | | Manual_Inq | 7 | 1 | Manual mode (controlled by the user) |
| | | MIN_Value | (8 ... 19) | 0 | MIN value for this feature control |
| | | MAX_Value | (20 ... 31) | 640 | MAX value for this feature control |

Shutter Inquiry

| Offset | Name | Field | Bit | Value | Description |
|---|---|---|---|---|---|
| 51C (Read only) | SHUTTER_INQ | Presence Inq | 0 | 1 | Presence of this feature |
| | | | (1 ... 2) | 0 | Reserved |
| | | One_Push_Inq | 3 | 0 | One push auto mode (Controlled automatically by camera only once) |
| | | Read/Out_Inq | 4 | 1 | Capability of reading the value of this feature |
| | | On/Off_Inq | 5 | 0 | Capability of switching this feature ON and OFF |
| | | Auto_Inq | 6 | 1 | Auto mode (controlled by camera) |
| | | Manual_Inq | 7 | 0 | Manual mode (controlled by the user) |
| | | MIN_Value | (8 ... 19) | 0 | MIN value for this feature control |
| | | MAX_Value | (20 ... 31) | 400 | MAX value for this feature control |

Gain Inquiry

| Offset | Name | Field | Bit | Value | Description |
|---|---|---|---|---|---|
| 520 (Read only) | GAIN_INQ | Presence Inq | 0 | 1 | Presence of this feature |
| | | | (1 ... 2) | 0 | Reserved |
| | | One_Push_Inq | 3 | 0 | One push auto mode (Controlled automatically by camera only once) |
| | | Read/Out_Inq | 4 | 1 | Capability of reading |

-continued

Gain Inquiry

| Offset | Name | Field | Bit | Value | Description |
|---|---|---|---|---|---|
| | | | | | the value of this feature |
| | | On/Off_Inq | 5 | 0 | Capability of switching this feature ON and OFF |
| | | Auto_Inq | 6 | 0 | Auto mode (controlled by camera) |
| | | Manual_Inq | 7 | 1 | Manual mode (controlled by the user) |
| | | MIN_Value | (8 ... 19) | 0 | MIN value for this feature control |
| | | MAX_Value | (20 ... 31) | A28 | MAX value for this feature control |

Temperature Inquiry

| Offset | Name | Field | Bit | Value | Description |
|---|---|---|---|---|---|
| 52C (Read only) | TEMPERATURE_INQ | Presence_Inq | 0 | 1 | Presence of this feature |
| | | | (1 ... 2) | 0 | Reserved |
| | | One_Push_Inq | 3 | 0 | One push auto mode (Controlled automatically by camera only once) |
| | | Read/Out_Inq | 4 | 1 | Capability of reading the value of this feature |
| | | On/Off_Inq | 5 | 0 | Capability of switching this feature ON and OFF |
| | | Auto_Inq | 6 | 1 | Auto mode (controlled by camera) |
| | | Manual_Inq | 7 | 0 | Manual mode (controlled by the user) |
| | | MIN_Value | (8 ... 19) | 0 | MIN value for this feature control in degree C. |
| | | MAX_Value | (20 ... 31) | 7Ch | MAX value for this feature control in degree C. |

| | | Trigger Inquiry | | | |
|---|---|---|---|---|---|
| Offset | Name | Field | Bit | Val | Description |
| 530 (Read only) | TRIGGER_INQ | Presence_Inq | 0 | 1 | Presence of this feature |
| | | | (1 . . . 3) | 0 | Reserved |
| | | Read/Out_Inq | 4 | 1 | Capability of reading the value of this feature |
| | | On/Off_Inq | 5 | 1 | Capability of switching this feature ON and OFF |
| | | Polarity_Inq | 6 | 0 | Capability of changing the polarity of the trigger input |
| | | | (7 . . . 15) | 0 | Reserved |
| | | Trigger_Mode0_Inq | 16 | 1 | Presence of Trigger mode 0 |
| | | Trigger_Mode1_Inq | 17 | 0 | Presence of Trigger mode 1 |
| | | Trigger_Mode2_Inq | 18 | 0 | Presence of Trigger mode 2 |
| | | Trigger_Mode3_Inq | 19 | 1 | Presence of Trigger mode 3 |
| | | | (20 . . . 31) | 0 | Reserved |

| | | Status and Control Registers for Camera | | | |
|---|---|---|---|---|---|
| Offset | Name | Field | Bit | Value | Description |
| 600 (Read/Only) | Cur-Frame_Rate | Cur_Frame_Rate | [0–2] | 3 | Current video mode Mode_0–Mode_7 |
| | | | 3 . . . 31 | 0 | Reserved |
| 604 (Read/Only) | Cur_V_Mode | Cur_V_Mode | 0 . . . 2 | 0 | Current video mode Mode_0 . . . Mode_7 |
| | | | 3 . . . 31 | 0 | Reserved |
| 608 (Read/Only) | Cur_V_Format | Cur_V_Format | (0 . . . 2) | 7 | Current video Format Format 0 . . . Format_7 |
| | | | (3 . . . 31) | 0 | Reserved |
| 60C (Read/Write) | ISO | ISO_Channel | (0 . . . 3) | 0 | Isochronous channel number for video data transmission |
| | | | (4 . . . 5) | 0 | Reserved |
| | | ISO_Speed | (6 . . . 7) | 2 | Isochronous transmit speed code |
| | | | (8 . . . 31) | 0 | Reserved |
| 614 (Read/Write) | ISO_EN | ISO_EN | 0 | 0 | 1 = Start ISO transmission of data 0 = Stop ISO transmission of data |
| | | | (1 . . . 31) | 0 | Reserved |
| 61C (Read/Write) | ONE-SHOT | One_Shot | 0 | 0 | 1 - only one frame of video data is transmitted (self |

-continued

Status and Control Registers for Camera

| Offset | Name | Field | Bit | Value | Description |
|---|---|---|---|---|---|
| | | | | | cleared after exposure) |
| | | Multi_Shot | 1 | 0 | 1 = N Frames of video data is transmitted |
| | | | (2 ... 16) | 0 | Reserved |
| | | Control Number | (16 ... 31) | 0 | Count number for Multi-shot function |

Feature Status and Control Registers
Brightness Status and Control

| Offset | Name | Field | Bit | Value | Description |
|---|---|---|---|---|---|
| 800 (Read/Write Non-volatile) | BRIGHTNESS | Presence_Inq | 0 | 1 | Presence of this feature |
| | | | (1 ... 4) | 0 | Reserved |
| | | One_Push | 5 | 0 | Write "1" to begin work (self cleared) |
| | | ON_OFF | 6 | 1 | 0 = OFF; 1 = ON |
| | | A_M_Mode | 7 | 0 | 0 = manual; 1 = auto |
| | | | (8 ... 19) | 0 | Reserved |
| | | Value | (20 ... 31) | Calibrate | Value |

Shutter Status and Control

| Offset | Name | Field | Bit | Value | Description |
|---|---|---|---|---|---|
| 81C (Read/Only) | SHUTTER | Presence Inq | 0 | 1 | Presence of this feature |
| | | | (1 ... 4) | 0 | Reserved |
| | | One_Push | 5 | 0 | Write "1" to begin work (self cleared) |
| | | ON_OFF | 6 | 1 | 0 = OFF; 1 = ON |
| | | A_M_Mode | 7 | 1 | 0 = manual; 1 = auto |
| | | | (8 ... 19) | 0 | Reserved |
| | | Value | (20 ... 31) | Variable | Value |

Gain Status and Control

| Offset | Name | Field | Bit | Val | Description |
|---|---|---|---|---|---|
| 820 (Read/Write Non-volatile) | GAIN | Presence_Inq | 0 | 1 | Presence of this feature |
| | | | (1 ... 4) | 0 | Reserved |
| | | One_Push | 5 | 0 | Write "1" to begin work (self cleared) |
| | | On_Off_Inq | 6 | 1 | 0 = OFF; 1 = ON |
| | | A_M_Mode | 7 | 0 | 0 = manual; 1 = auto |
| | | | 8 ... 19 | 0 | Reserved |
| | | Value | 20 ... 31 | calibrate | Value |

Temperature Status

| Offset | Name | Field | Bit | Value | Description |
|---|---|---|---|---|---|
| 82C (Read only) | TEMPERATURE | Presence_Inq | 0 | 1 | Presence of this feature |
| | | | (1 ... 4) | 0 | Reserved |
| | | One_Push | 5 | 0 | Write "1" to begin work (self cleared) |
| | | On_Off_Inq | 6 | 1 | 0 = OFF; 1 = ON |
| | | A_M_Mode | 7 | 1 | 0 = manual; 1 = auto |
| | | Target Temperature | 8 ... 19 | 0 | Aimed value of the temperature |
| | | Temperature | 20 ... 31 | variable | Temperature at the present time (no default) |

Trigger Mode Status and Control

| Offset | Name | Field | Bit | Value | Description |
|---|---|---|---|---|---|
| 830 (Read/Write) | TRIGGER_MODE | Presence Inq | 0 | 1 | Presence of this feature |
| | | | (1 ... 5) | zero | Reserved |
| | | ON_OFF | 6 | 0 | 0-OFF; 1-ON |
| | | Trigger Polarity | 7 | 1 | 0-active low input; 1-active high input |
| | | | (8 ... 11) | 0 | Reserved |
| | | Trigger Mode | (12 ... 15) | 0 | Trigger mode |
| | | | (16 ... 19) | 0 | Reserved |
| | | Parameter | (20 ... 31) | 0 | Parameter for trigger function |

Embodiments of the present invention use an additional CSR to provide registers for illumination control, calibration data and other unique functions. These functions are not part of the standard 1394-based Digital Camera Specification and were implemented using an advanced feature CSR Address of the advanced feature CSR is: Bus_ID, Node_ID, 0xFFFF FFF0 0000.

Access Control Register

| Offset | Name | Field | Bit | Value | Description |
|---|---|---|---|---|---|
| 000 (WRITE) | ACCESS_CONTROL_REG | Feature ID_Hi | (0 ... 31) | ffffffff | Write the upper quadlet of Feature ID |
| 004 (WRITE) | | Feature ID_Lo | (0 ... 15) | ffff | Write the lower doublet of Feature ID |
| | | | (16 ... 19) | f | Constant |
| | | Time_Out | (20 ... 31) | fff | Time-out value from unlocking CSR to using it in mS. |
| 000 (READ) | | Node ID | (0 ... 15) | ffff | Bus ID Node ID |
| | | | (16 ... 31) | ffff | Constant |

-continued

Access Control Register

| Offset | Name | Field | Bit | Value | Description |
|---|---|---|---|---|---|
| 004 (READ) | | Time_Out | (0 . . . 19) (20 . . . 31) | ffff fff | Constant Time-out value from unlocking CSR to using it in mS. |

Inquiry Registers for Advanced Functions

| Offset | Name | Field | Bit | Value | Description |
|---|---|---|---|---|---|
| 008 (Read) | Communication | Bandwidth_claim | 0 | 0 | Switch Isochionous channel ON/OFF |
| | | | (1 . . . 31) | 0 | Reserved |
| 010 (Read) | Illumination | Illum_Centroid | 0 | 1 | Centroid control |
| | | Illum_Latency | 1 | 1 | Time from bigger to possible illumination in nanoseconds |
| | | Illum Step Size | 2 | 1 | Illumination duration in nanoseconds |
| | | | [3–5] | 0 | Reserved |
| | | Illum_Type_1 | 6 | 1 | Illumination type definition |
| | | Illum-_Duration_1 | 7 | 1 | Illumination Duration Control |
| | | Illum_Intensity_1 | 8 | 1 | Illumination Intensity control |
| | | Illum_Counter_1 | 9 | 1 | Illumination counter control |
| | | | [10–11] | 0 | Reserved |
| | | Illum_Type_2 | 12 | 1 | Illumination type definition |
| | | Illum-_Duration_2 | 13 | 1 | Illumination Duration Control |
| | | Illum_Intensity_2 | 14 | 1 | Illumination Intensity control |
| | | Illum_Counter_2 | 15 | 1 | Illumination counter control |
| | | | [16–17] | 0 | Reserved |
| | | Illum_Type_3 | 18 | 0 | Illumination type definition |
| | | Illum-_Duration_3 | 19 | 0 | Illumination Duration Control |
| | | Illum_Intensity_3 | 20 | 0 | Illumination Intensity control |
| | | Illum_Counter_3 | 21 | 0 | Illumination counter control |
| | | | [22–23] | 0 | Reserved (more Illumination |

Inquiry Registers for Advanced Functions

| Offset | Name | Field | Bit | Value | Description |
|---|---|---|---|---|---|
| | | | | | units) |
| | | Illum_Type_4 | 24 | 0 | Illumination type definition |
| | | Illum_Duration_4 | 25 | 0 | Illumination Duration control |
| | | Illum_Intensity_4 | 26 | 0 | Illumination Intensity control |
| | | Illum_Counter_4 | 27 | 0 | Illumination counter control |
| | | | [28–31] | zero | Reserved (more Illumination units) |
| 018 (Read) | Optical | Pixel_Size | 0 | 1 | Pixel Size |
| | | aux 1 | 1 | 1 | Auxiliary field for future use |
| | | aux 2 | 2 | 1 | Auxiliary field for future use |
| | | aux 3 | 3 | 1 | Auxiliary field for future use |
| | | | [4–31] | 0 | Reserved |
| 020 (Read) | Mechanical | x_offset | 0 | 1 | x-axis offset in μm |
| | | y_offset | 1 | 1 | y-axis offset in μm |
| | | theta_offset | 2 | 1 | theta offset in μm |
| | | | 3 | 0 | |
| | | aux 4 | 4 | 1 | Auxiliary field for future use |
| | | aux_5 | 5 | 1 | Auxiliary field for future use |
| | | aux_6 | 6 | 1 | Auxiliary field for future use |
| | | Temp_Comp_x | 7 | 1 | Temperature compensation in x |
| | | Temp_Comp_y | 8 | 1 | Temperature compensation in y |
| | | | [9–31] | 0 | Reserved |

Inquiry Registers for Illumination Features

| Offset | Name | Field | Bit | Value | Description |
|---|---|---|---|---|---|
| 140 (Read) | Illum_controid_Inq | Presence Inq | 0 | 1 | Presence of this feature |
| | | | (1 . . . 3) | 0 | Reserved |
| | | Read/Out_Inq | 4 | 1 | Capability of reading the value of this feature |
| | | On/Off_Inq | 5 | 0 | Capability of switching this feature on and off |
| | | Auto Inq | 6 | 0 | Auto Mode |
| | | Manual Inq | 7 | 1 | Manual mode (Controlled |

-continued

Inquiry Registers for Illumination Features

| Offset | Name | Field | Bit | Value | Description |
|---|---|---|---|---|---|
| | | | | | by the user) |
| | | MIN Value | (8 ... 19) | 0 | MIN value for this feature control |
| | | MAX Value | (20 ... 31) | 1FF | MAX value for this feature control |
| 144 (Read) | Illum_latency_inq | Presence Inq | 0 | 1 | Presence of this feature |
| | | | (1 ... 3) | 0 | Reserved |
| | | Illum_latency | (4 ... 31) | 1A2C | Illumination level unit in nanoseconds |
| 148 (Read) | Illum_step_size_inq | Presence_Inq | 0 | 1 | Presence of this feature |
| | | | (1 ... 3) | 0 | Reserved |
| | | Illum_step_size | (4 ... 31) | 2710 | Illumination level unit in nanoseconds |
| 14C–154 | | Reserve 3 register addresses | | | |
| 158 (Read) | Illum_type_1_inq | Presence_Inq | 0 | 1 | Presence of this feature |
| | | | (1 ... 3) | 0 | Reserved |
| | | Darkfield_Inq | 4 | 1 | It is a darkfield illuminator |
| | | Brightfield_Inq | 5 | 0 | It is a brightfield illuminator |
| | | Type_3_Inq | 6 | 0 | It is a reflection illuminator |
| | | Type_4_Inq | 7 | 0 | It is a active marker illuminator |
| | | | (8 ... 31) | zero | Reserved |
| 15C (Read) | Illum_duration_1_Inq | Presence_Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 1 | Capability of switching this feature on and off |
| | | Auto_Inq | 6 | 0 | Auto Mode |
| | | Manual_Inq | 7 | 1 | Manual mode (Controlled by the user) |
| | | MIN Value | (8 ... 19) | 0 | MIN value for this feature control |
| | | MAX Value | (20 ... 31) | 3E8 | MAX value for this feature control |
| 160 (Read) | Illum_intensity_1_inq | Presence_Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 0 | Capability of switching this feature on and off |
| | | Auto_Inq | 6 | 0 | Auto Mode |
| | | Manual_Inq | 7 | 1 | Manual mode (Controlled by the user) |
| | | MIN Value | (8 ... 19) | 0 | MIN value for this feature control |

-continued

Inquiry Registers for Illumination Features

| Offset | Name | Field | Bit | Value | Description |
|---|---|---|---|---|---|
| | | MAX Value | (20 ... 31) | BAA | MAX value for this feature control |
| 164 (Read) | Illum_counter_1_inq | Presence_Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 0 | Capability of switching this feature on and off |
| | | Auto_Inq | 6 | 1 | Auto Mode (Camera will increase the counter every illumination flash) |
| | | Manual_Inq | 7 | 1 | Manual mode(setting the counter with a specific number) |
| | | MAX Value | (8 ... 31) | FFFFFF | Max that can be written to the control |
| 168–16C | | Reserve 2 register addresses | | | |
| 170 (Read) | Illum_type_2_Inq | Presence_Inq | 0 | 1 | Presence of this feature |
| | | | (1 ... 3) | zero | Reserved |
| | | Darkfield_Inq | 4 | 1 | It is a darkfield illuminator |
| | | Brightfield_Inq | 5 | 0 | It is a brightfield illuminator |
| | | Type_3_Inq | 6 | 0 | It is a Type 3 illuminator |
| | | Type_4_Inq | 7 | 0 | It is a Type 4 illuminator |
| | | | (8 ... 31) | zero | Reserved |
| 174 (Read) | Illum_duration_2_Inq | Presence Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 1 | Capability of switching this feature on and off |
| | | Auto Inq | 6 | 0 | Auto Mode |
| | | Manual Inq | 7 | 1 | Manual mode (Controlled by the user) |
| | | MIN Value | (8 ... 19) | 0 | MIN value for this feature control |
| | | MAX Value | (20 ... 31) | 3E8 | MAX value for this feature control |
| 178 (Read) | Illum_intensity_2_Inq | Presence Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 0 | Capability of switching this feature |

-continued

Inquiry Registers for Illumination Features

| Offset | Name | Field | Bit | Value | Description |
|---|---|---|---|---|---|
| | | Auto Inq | 6 | 0 | on and off<br>Auto Mode |
| | | Manual Inq | 7 | 1 | Manual mode (Controlled by the user) |
| | | MIN Value | (8 ... 19) | 0 | MIN value for this feature control |
| | | MAX Value | (20 ... 31) | 900 | MAX value for this feature control |
| 17C (Read) | Illum_counter_2_Inq | Presence Inq | 0 | 1 | Presence of this feature |
| | | | (1 ... 3) | zero | Reserved |
| | | Read/Out_Inq | 4 | 1 | Capability of reading the value of this feature |
| | | On/Off_Inq | 5 | 0 | Capability of switching this feature on and off |
| | | Auto_Inq | 6 | 1 | Auto Mode (Camera will increase the counter every illumination flash) |
| | | Manual_Inq | 7 | 1 | Manual mode (setting the counter with a specific number) |
| | | MAX Value | (8 ... 31) | FFFFFF | Max that can be written to the control |
| 180–184 | | Reserve 2 register addresses | | | |
| 188 (Read) | Illum_type_3_Inq | Presence_Inq | 0 | 0 | Presence of this feature |
| | | | [1–3] | zero | Reserved |
| | | Darkfield_Inq | 4 | 0 | It is a darkfield illuminator |
| | | Brightfield_Inq | 5 | 0 | It is a brightfield illuminator |
| | | Type_3_Inq | 6 | 0 | It is a Type 3 illuminator |
| | | Type_4_Inq | 7 | 0 | It is a Type 4 illuminator |
| | | | [8–31] | zero | Reserved |
| 18C (Read) | Illum_duration_3_Inq | Presence_Inq | 0 | 0 | Presence of this feature |
| | | | [1–3] | zero | Reserved |
| | | Read/Out_Inq | 4 | 0 | Capability of reading the value of this feature |
| | | On/Off_Inq | 5 | 0 | Capability of switching this feature on and off |
| | | Auto Inq | 6 | 0 | Auto Mode |
| | | Manual_Inq | 7 | 0 | Manual mode (controlled by the user) |
| | | MIN_Value | [8–19] | 0 | MIN value for this feature control |
| | | MAX_Value | [20–31] | 000 | MAX value for this feature control |
| 190 (Read) | Illum_intensity_3_ | Presence_Inq | 0 | 0 | Presence of this feature |

-continued

Inquiry Registers for Illumination Features

| Offset | Name | Field | Bit | Value | Description |
|---|---|---|---|---|---|
| | Inq | | [1–3] | zero | Reserved |
| | | ReadOut_Inq | 4 | 0 | Capability of reading the value of this feature |
| | | On/Off_Inq | 5 | 0 | Capability of switching this feature on and off |
| | | Auto_Inq | 6 | 0 | Auto Mode |
| | | Manual_Inq | 7 | 0 | Manual mode (controlled by the user) |
| | | MIN_Value | [8–19] | 0 | MIN value for this feature control |
| | | MAX_Value | [20–31] | 000 | MAX value for this feature control |
| 194 (Read) | Illum_counter_3_Inq | Presence_Inq | 0 | 0 | Presence of this feature |
| | | | [1–3] | zero | Reserved |
| | | ReadOut_Inq | 4 | 0 | Capability of reading the value of this feature |
| | | On/Off_Inq | 5 | 0 | Capability of switching this feature on and off |
| | | Auto_Inq | 6 | 0 | Auto Mode (Camera will increase the counter every illumination flash) |
| | | Manual_Inq | 7 | 0 | Manual mode (setting the counter with a specific number) |
| | | MAX_Value | [8–31] | 000000 | Max that can be written to the control |
| 198–19C | | Reserve 2 register address | | | |
| 1A0 (Read) | Illum_type_4_Inq | Presence_Inq | 0 | 0 | Presence of this feature |
| | | | [1–3] | zero | Reserved |
| | | Darkfield_Inq | 4 | 0 | It is a darkfield iluminator |
| | | Brightfield_Inq | 5 | 0 | It is a brightfield illuminator |
| | | Type_3_Inq | 6 | 0 | It is a Type 3 illuminator |
| | | Type_4_Inq | 7 | 0 | It is a Type 4 illuminator |
| | | | [8–31] | zero | Reserved |
| 1A4 | Illum_duration_4_Inq | Presence_Inq | 0 | 0 | Presence of this feature |
| | | | [1–3] | zero | Reserved |
| | | ReadOut_Inq | 4 | 0 | Capability of reading the value of this feature |
| | | On/Off_Inq | 5 | 0 | Capability of switching this feature on and off |
| | | Auto_Inq | 6 | 0 | Auto Mode |
| | | Manual_Inq | 7 | 0 | Manual mode (controlled by the user) |
| | | MIN_Value | [8–19] | 0 | MIN value for |

Inquiry Registers for Illumination Features

| Offset | Name | Field | Bit | Value | Description |
|---|---|---|---|---|---|
| | | MAX_Value | [20–31] | 000 | MAX value for this feature control |
| 1A8 | Illum_intensity_4_Inq | Presence_Inq | 0 | 0 | Presence of this feature |
| | | | [1–3] | zero | Reserved |
| | | ReadOut_Inq | 4 | 0 | Capability of reading the value of this feature |
| | | On/Off_Inq | 5 | 0 | Capability of switching this feature on and off |
| | | Auto_Inq | 6 | 0 | Auto Mode |
| | | Manual_Inq | 7 | 0 | Manual mode (controlled by the user) |
| | | MIN_Value | [8–19] | 0 | MIN value for this feature control |
| | | MAX_Value | [20–31] | 000 | MAX value for this feature control |
| 1AC | Illum_counter_4_Inq | Presence_Inq | 0 | 0 | Presence of this feature |
| | | | [1–3] | zero | Reserved |
| | | ReadOut_Inq | 4 | 0 | Capability of reading the value of this feature |
| | | On/Off_Inq | 5 | 0 | Capability of switching this feature on and off |
| | | Auto_Inq | 6 | 0 | Auto Mode (Camera will increase the counter every illumination flash) |
| | | Manual_Inq | 7 | 0 | Manual mode (setting the counter with a specific number) |
| | | MAX_Value | [8–31] | 000000 | Max that can be written to the control |

Inquiry Registers for Optical Features

| Offset | Name | Field | Bit | Value | Description |
|---|---|---|---|---|---|
| 200 (Read) | Pixel_Size_Inq | Presence Inq | 0 | 1 | Presence of this feature |
| | | | [1–3] | 0 | Reserved |
| | | Read/Out_Inq | 4 | 1 | Capability of reading the value of this feature |
| | | On/Off_Inq | 5 | 1 | Capability of switching this feature on and off |
| | | Auto_Inq | 6 | 0 | Auto Mode |
| | | Manual_Inq | 7 | 1 | Manual mode (Controlled |

-continued

Inquiry Registers for Optical Features

| Offset | Name | Field | Bit | Value | Description |
|---|---|---|---|---|---|
| | | MAX Value | [8–31] | FFFFFF | by the user)<br>MAX value for this feature control |
| 204 | Auxillary_1_Inq | Presence Inq | 0 | 1 | Presence of this feature |
| 208 | Auxillary_2_Inq | | (1 ... 3) | 0 | Reserved |
| 20C (Read) | Auzillary_3_Inq | ReadOut_Inq | 4 | 1 | Capability of reading the value of this feature |
| | | On/Off_Inq | 5 | 1 | Capability of switching this feature on and off |
| | | Auto_Inq | 6 | 0 | Auto Mode |
| | | Manual_Inq | 7 | 1 | Manual mode (Controlled by the user) |
| | | MAX Value | (20 ... 31) | FFFFFF | MAX value for this feature control |
| 210 | DistortionA_1_1_Inq | Presence Inq | 0 | 1 | Presence of this feature |
| 214 | DistortionA_1_2_Inq | | | | |
| 218 | DistortionA_1_3_Inq | | [1–3] | zero | Reserved |
| 21C | DistortionA_1_4_Inq | ReadOut_Inq | 4 | 1 | Capability of reading the value of this feature |
| 220 | DistortionA_2_1_Inq | | | | |
| 224 | DistortionA_2_2_Inq | | | | |
| 228 | DistortionA_2_3_Inq | | | | |
| 230 | DistortionA_2_4_Inq | On/Off_Inq | 5 | 1 | Capability of switching this feature on and off |
| 234 | DistortionA_3_1_Inq | | | | |
| 238 | DistortionA_3_2_Inq | | | | |
| 23C | DistortionA_3_3_Inq | | | | |
| 240 | DistortionA_3_4_Inq | Auto_Inq | 6 | 0 | Auto Mode |
| 244 | DistortionA_4_1_Inq | Manual_Inq | 7 | 1 | Manual mode (Controlled by the user) |
| 248 | DistortionA_4_2_Inq | | | | |
| 24C (Read) | DistortionA_4_3_Inq | | | | |
| | DistortionA_4_4_Inq | MAX Value | [8–31] | FFFFFF | MAX value for this feature control |
| 210 | DistortionB_1_1_Inq | Presence Inq | 0 | 1 | Presence of this feature |
| 214 | DistortionB_1_2_Inq | | | | |
| 218 | DistortionB_1_3_Inq | | [1–3] | zero | Reserved |
| 21C | DistortionB_1_4_Inq | ReadOut_Inq | 4 | 1 | Capability of reading the value of this feature |
| 220 | DistortionB_2_1_Inq | | | | |
| 224 | DistortionB_2_2_Inq | | | | |
| 228 | DistortionB_2_3_Inq | | | | |
| 230 | DistortionB_2_4_Inq | On/Off_Inq | 5 | 1 | Capability of switching this feature on and off |
| 234 | DistortionB_3_1_Inq | | | | |
| 238 | DistortionB_3_2_Inq | | | | |
| 23C | DistortionB_3_3_Inq | | | | |
| 240 | DistortionB_3_4_Inq | Auto Inq | 6 | 0 | Auto Mode |
| 244 | DistortionB_4_1_Inq | Manual_Inq | 7 | 1 | Manual mode (Controlled by the user) |
| 248 | DistortionB_4_2_Inq | | | | |
| 24C (Read) | DistortionB_4_3_Inq | | | | |
| | DistortionB_4_4_Inq | MAX Value | [8–31] | FFFFFF | MAX value for this feature control |

Inquiry Registers for Mechanical Features

| Offset | Name | Field | Bit | Value | Description |
|---|---|---|---|---|---|
| 300 (Read) | X_offset_Inq | Presence Inq | 0 | 1 | Presence of this feature |
| | | | (1 ... 3) | 0 | Reserved |
| | | Read/Out_-Inq | 4 | 1 | Capability of reading the value of this feature |

-continued

Inquiry Registers for Mechanical Features

| Offset | Name | Field | Bit | Value | Description |
|---|---|---|---|---|---|
| | | On/Off_Inq | 5 | 1 | Capability of switching this feature on and off |
| | | Auto_Inq | 6 | 0 | Auto Mode |
| | | Manual_Inq | 7 | 1 | Manual mode (Controlled by the user) |
| | | | [8–15] | 0 | Reserved |
| | | MAX_Value | [16...31] | FFFF | MAX value for this feature control |
| 304 (Read) | Y_offset_Inq | Presence Inq | 0 | 1 | Presence of this feature |
| | | | (1...3) | 0 | Reserved |
| | | Read/Out_-Inq | 4 | 1 | Capability of reading the value of this feature |
| | | On/Off_Inq | 5 | 1 | Capability of switching this feature on and off |
| | | Auto_Inq | 6 | 0 | Auto Mode |
| | | Manual_Inq | 7 | 1 | Manual mode (Controlled by the user) |
| | | MIN Value | [8...15] | 0 | Reserved |
| | | MAX Value | [16...31] | FFFF | MAX value for this feature control |
| 308 (Read) | Theta_ offest_ Inq | Presence_ Inq | 0 | 1 | Presence of this feature |
| | | | [1–3] | 0 | Reserved |
| | | Read/Out_ Inq | 4 | 1 | Capability of reading the value of this feature |
| | | On/Off_Inq | 5 | 1 | Capability of switching this feature ON and OFF |
| | | Auto_Inq | 6 | 0 | Auto mode |
| | | Manual_Inq | 7 | 1 | Manual mode (controlled by the user) |
| | | | [8–15] | 0 | Reserved |
| | | MAX_Value | [16–31] | FFFF | MAX value for this feature control |
| 310 | Auxillary_ 4_Inq | Presence Inq | 0 | 1 | Presence of this feature |
| 314 | Auxillary_ 5_Inq | | (1...3) | 0 | Reserved |
| 318 (Read) | Auxillary_ 6_Inq | Read/Out_ Inq | 4 | 1 | Capability of reading the value of this feature |
| | | On/Off_Inq | 5 | 1 | Capability of switching this feature ON and OFF |
| | | Auto_Inq | 6 | 0 | Auto mode |
| | | Manual_Inq | 7 | 1 | Manual mode (controlled by the user) |
| | | MAX_Value | [8–13] | FFFFF | MAX value for this feature control |
| 31C | Temp_Comp_ x_Inq | Presence Inq | 0 | 1 | Presence of this feature |
| 310 | Temp_Comp_ y_Inq | | (1...3) | 0 | Reserved |
| | | ReadOut_ Inq | 4 | 1 | Capability of reading the value of this feature |
| | | On/Off_Inq | 5 | 1 | Capability of switching this feature ON and OFF |

-continued

Inquiry Registers for Mechanical Features

| Offset | Name | Field | Bit | Value | Description |
|---|---|---|---|---|---|
| | | Auto_Inq | 6 | 0 | Auto mode |
| | | Manual_Inq | 7 | 1 | Manual mode (controlled by the user) |
| | | Max_Value | [8–31] | FFFFFF | MAX value for this feature control |

Status and Control Registers for the Advanced Features

Status and Control Registers for Communication Features

This status control provides a way to allocate an isochronous channel. After this control is activated, the One Shot command does not have to build-up a channel after the command. this will provide a short and predictable image intake time.

Status and Control Registers for Illumination Features

| Offset | Name | Field | Bit | Value | Description |
|---|---|---|---|---|---|
| 500 (Read/ Write Volatile) | Illum_ centroid | Presence_Inq | 0 | 1 | Presence of this feature |
| | | | (1 . . . 5) | 0 | Reserved |
| | | ON_OFF | 6 | 1 | Write: Switch this feature ON/OFF Read: read current mode 0 - OFF; 1 - ON |
| | | A_M_Mode | 7 | 0 | Write: Set the Mode Read: read the current mode 0 = Manual; 1 = Auto |
| | | | 8 . . . 19 | 0 | Reserved |
| | | Value | 20 . . . 31 | 0 | Value Write the value in auto mode. This field is ignored if read unit capability is not available, read value has no meaning. |
| 504–508 | | | Reserve 2 register addresses | | |
| 50C (Read/ Write Volatile) | Illum_ duration_1 | Presence_Inq | 0 | 1 | Presence of this feature |
| | | | 1 . . . 5 | 0 | Reserved |
| | | ON_OFF | 6 | 0 | Write: Switch this feature ON/OFF Read: read current mode 0 = OFF; 1 = ON |
| | | A_M_Mode | 7 | 0 | Write: Set the Mode Read: read the current mode 0 = Manual; 1 = Auto |
| | | | 8 . . . 19 | 0 | Reserved |
| | | Value | 20 . . . 31 | 0 | Value Write the value in auto mode: This field is ignored. If read unit capability is |

-continued

Status and Control Registers for Illumination Features

| Offset | Name | Field | Bit | Value | Description |
|---|---|---|---|---|---|
| | | | | | not available, read value has no meaning. |
| 510 (Read/ Write Non-Volatile) | Illum_ intensity_1 | Presence Inq | 0 | 1 | Presence of this feature |
| | | | (1 . . . 5) | zero | Reserved |
| | | ON_OFF | 6 | 1 | Write: Switch this feature ON/OFF Read: read current mode 0 = OFF; 1 = ON |
| | | A_M_Mode | 7 | 0 | Write: Set the Mode Read: read the current mode 0 = Manual; 1 = Auto |
| | | | 8 . . . 19 | 0 | Reserved |
| | | Value | (20 . . . 31) | 0 | Value Write the value in auto mode. This field is ignored. If read not capability is not available, read value has no meaning. |
| 514 (Read/ Write Non-Volitile) | Illum_counter_1 | Presence Inq | 0 | 1 | Presence of this feature |
| | | | (1 . . . 5) | zero | Reserved |
| | | ON_OFF | 6 | 1 | Write: Switch this feature ON/OFF Read: read current mode 0-OFF 1-ON |
| | | A_M_Mode | 7 | 1 | Write: Set the Mode Read: read current mode 0-Manual 1-Auto |
| | | value | (8 . . . 31) | 0 | Value Write the Value in auto mode. This field is ignored. If read unit capability is not available, read value has no meaning. |
| 518–51C | | Reserve register addresses | | | |
| 520 (Read/ Write Volitile) | Illum_ duration_2 | Presence Inq | 0 | 1 | Presence of this feature |
| | | | (1 . . . 5) | zero | Reserved |
| | | ON_OFF | 6 | 0 | Write: Switch this feature ON/OFF Read: read current mode 0-OFF 1-ON |
| | | A_M_Mode | 7 | 0 | Write: Set the Mode Read: read current mode |

-continued

Status and Control Registers for Illumination Features

| Offset | Name | Field | Bit | Value | Description |
|---|---|---|---|---|---|
| | | | | | 0-Manual 1-Auto |
| | | | (8 ... 19) | zero | Reserved |
| | | Value | (20 ... 31) | 0 | Value Write the value in auto mode. This field is ignored. If read unit capability is not available, read value has no meaning. |
| 524 (Read/Write Non-Volatile) | Illum_intensity_2 | Presence Inq | 0 | 1 | Presence of this feature |
| | | | (1 ... 5) | zero | Reserved |
| | | ON_OFF | 6 | 1 | Write: Switch this feature ON/OFF Read: read current mode 0-OFF 1-ON |
| | | A_M_Mode | 7 | 0 | Write: Set the Mode Read: read current mode 0-Manual 1-Auto |
| | | | (8 ... 19) | zero | Reserved |
| | | Value | (20 ... 31) | 0 | Value Write the value in auto mode. This field is ignored. If read unit capability is not available, read value has no meaning. |
| 528 (Read/Write Non-Volitile) | Illum_counter_2 | Presence_Inq | 0 | 1 | Presence of this feature |
| | | | (1 ... 5) | zero | Reserved |
| | | ON_OFF | 6 | 1 | Write: Switch this feature ON/OFF Read: read current mode 0-OFF 1-ON |
| | | A_M_Mode | 7 | 1 | Write: Set the Mode Read: read current mode 0-Manual 1-Auto |
| | | Value | (8 ... 31) | 0 | Value Write the value in auto mode This field is ignored. If read unit capability is not available, read value has no meaning. |

-continued

Status and Control Registers for Illumination Features

| Offset | Name | Field | Bit | Value | Description |
|---|---|---|---|---|---|
| 52C–530 | | Reserve 5 register addresses | | | |
| 534 (Read/Write) Volatile | Illum_duration_3 | Presence_Inq | 0 | 0 | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 7 | 0 | Write: Set the Mode Read: read current mode 0: Manual 1: Auto |
| | | | [8–19] | zero | Reserved |
| | | Value | [20–31] | 0 | Value |
| 538 (Read/Write) Non-Volatile | Illum_Intensity_3 | Presence_Inq | 0 | | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 7 | 0 | Write: Set the Mode Read: read the current mode 0: Manual 1: Auto |
| | | | [8–19] | zero | Reserved |
| | | Value | [20–31] | 0 | Value |
| 53C (Read/Write) Non-Volatile | Illum_counter_3 | Presence_Inq | 0 | 0 | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 0 | 0 | Write: Set the Mode Read: read the current mode 0: Manual 1: Auto |
| | | Value | [8–31] | 0 | Value |
| 540–544 | | Reserve 2 register address | | | |
| 548 (Read/Write) Volatile | Illum_duration_4 | Presence_Inq | 0 | 0 | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 7 | 0 | Write: Set the Mode Read: read current mode 0: Manual 1: Auto |
| | | | [8–19] | zero | Reserved |
| | | Value | [20–31] | 0 | Value |

-continued

Status and Control Registers for Illumination Features

| Offset | Name | Field | Bit | Value | Description |
|---|---|---|---|---|---|
| 54C (Read/Write) Non-Volatile | Illum_intensity_4 | Presence_Inq | 0 | 0 | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 7 | 0 | Write: Set the Mode Read: read current mode 0: Manual 1: Auto |
| | | | [8–19] | zero | Reserved |
| | | Value | [20–31] | 0 | Value |
| 550 (Read/Write) Non-Volatile | Illum_counter_4 | Presence_Inq | 0 | 0 | Presence of this feature |
| | | | [1–5] | zero | Reserved |
| | | ON_OFF | 6 | 0 | Write: Switch this feature ON/OFF Read: read current mode 0: OFF 1: ON |
| | | A_M_Mode | 7 | 0 | Write: Set the Mode Read: read current mode 0: Manual 1: Auto |
| | | Value | [8–31] | 0 | Value |

Status and Control Registers for Optical Features

| Offset | Name | Field | Bit | Value | Description |
|---|---|---|---|---|---|
| 600 (Read/Write Non-Volitile) | Pixel_Size | Presence Inq | 0 | 1 | Presence of this feature |
| | | | [1–5] | zero | Reserved |
| | | ON_OFF | 6 | 0 | Write: Switch this feature ON/OFF Read: read current mode 0-OFF 1-ON |
| | | A_M_Mode | 7 | 1 | Write: Set the Mode Read: read current mode 0-Manual 1-Auto |
| | | | [8–15] | zero | Reserved |
| | | Value | [16–31] | 0 | Value Write the value in auto mode. This field is ignored. If read unit capability is not available, read value has no meaning. |
| 604 | Auxillary_1 | Presence Inq | 0 | 1 | Presence of this feature |
| 608 | Auxillary_2 | | | | |
| 60C | Auxillary_3 | | [1 . . . 5] | zero | Reserved |

-continued

Status and Control Registers for Optical Features

| Offset | Name | Field | Bit | Value | Description |
|---|---|---|---|---|---|
| (Read/Write) Non-Volatile | | ON_OFF | 6 | 1 | Write: Switch this feature ON/OFF Read: read current mode 0-OFF 1-ON |
| | | A_M_Mode | 7 | 1 | Write: Set the Mode Read: read current mode 0-Manual 1-Auto |
| | | | [8–31] | zero | Reserved |
| 610 | DistortionA_1_1_Inq | Presence_Inq | 0 | 1 | Presence of this feature |
| 614 | DistortionA_1_2_Inq | | | | |
| 618 | DistortionA_1_3_Inq | | [1–5] | zero | Reserved |
| 61C | DistortionA_1_4_Inq | ON/OFF | 6 | 0 | Write: Switch this feature ON/OFF Read: read current mode 0: OFF = Data Invalid 1: ON = Date Value |
| 620 | DistortionA_2_1_Inq | | | | |
| 624 | DistortionA_2_2_Inq | | | | |
| 628 | DistortionA_2_3_Inq | | | | |
| 630 | DistortionA_2_4_Inq | | | | |
| 634 | DistortionA_3_1_Inq | | | | |
| 638 | DistortionA_3_2_Inq | | | | |
| 63C | DistortionA_3_3_Inq | | | | |
| 640 | DistortionA_3_4_Inq | | | | |
| 644 | DistortionA_4_1_Inq | A_M_Mode | 7 | 0 | Write: Set the Mode Read: read the current mode 0: = Manual, 1: Auto |
| 648 | DistortionA_4_2_Inq | | | | |
| 64C | DistortionA_4_3_Inq | | | | |
| (Read/Write) Non-Volatile | DistortionA_4_4_Inq | | | | |
| | | Value | [8–31] | 0 | Value |
| 650 | DistortionB_1_1_Inq | Presence_Inq | 0 | 1 | Presence of this feature |
| 654 | DistortionB_1_2_Inq | | | | |
| 658 | DistortionB_1_3_Inq | | [1–5] | zero | Reserved |
| 65C | DistortionB_1_4_Inq | ON/OFF | 6 | 0 | Write: Switch this feature ON/OFF Read: read current mode 0: OFF = Data Invalid 1: ON = Date Value |
| 660 | DistortionB_2_1_Inq | | | | |
| 664 | DistortionB_2_2_Inq | | | | |
| 668 | DistortionB_2_3_Inq | | | | |
| 670 | DistortionB_2_4_Inq | | | | |
| 674 | DistortionB_3_1_Inq | | | | |
| 678 | DistortionB_3_2_Inq | | | | |
| 67C | DistortionB_3_3_Inq | | | | |
| 680 | DistortionB_3_4_Inq | | | | |
| 684 | DistortionB_4_1_Inq | A_M_Mode | 7 | 0 | Write: Set the Mode Read: read the current mode 0: = Manual, 1: Auto |
| 688 | DistortionB_4_2_Inq | | | | |
| 68C | DistortionB_4_3_Inq | | | | |
| (Read/Write) Non-Volatile | DistortionB_4_4_Inq | | | | |
| | | Value | [8–31] | 1 | Value |

Status and Control Registers for Mechanical Features

| Offset | Name | Field | Bit | Value | Description |
|---|---|---|---|---|---|
| 700 (Read/Write Non-Volatile) | x_Offset | Presence_Inq | 0 | 1 | Presence of this feature |
| | | | [1–5] | zero | Reserved |
| | | ON_OFF | 6 | 0 | Write: Switch this feature ON/OFF Read: read current mode 0-OFF 1-ON |
| | | A_M_Mode | 7 | 0 | Write: Set the Mode Read: read current mode 0-Manual 1- |

-continued

Status and Control Registers for Mechanical Features

| Offset | Name | Field | Bit | Value | Description |
|---|---|---|---|---|---|
| | | Value | [8–15] | zero | Auto Reserved |
| | | | [16–31] | Calibrated | Signed 16 bit value range −32767 to +32767. Physical scale is 0.01 micrometer/bit Physical range is −327.67 to +327.67 micrometers. |
| 704 (Read/Write Non-Volitile) | Y_Offset | Presence_Inq | 0 | 1 | Presence of this feature |
| | | | [1–5] | zero | Reserved |
| | | ON_OFF | 6 | 0 | Write: Switch this feature ON/OFF Read: read current mode 0-OFF 1-ON |
| | | A_M_Mode | 7 | 0 | Write: Set the Mode Read: read current mode 0-Manual 1-Auto |
| | | Value | [8–15] | zero | Reserved |
| | | | [16–31] | Calibrated | Signed 16 bit value range −32767 to +32767. Physical scale is 0.01 micrometer/bit Physical range is −327.67 to +327.67 micrometers. |
| 708 (Read/Write Non-Volitile) | Theta_Offset | Presence Inq | 0 | 1 | Presence of this feature |
| | | | (1 . . . 5) | zero | Reserved |
| | | ON_OFF | 6 | 0 | Write: Switch this feature ON/OFF Read: read current mode 0-OFF 1-ON |
| | | A_M_Mode | 7 | 0 | Write: Set the Mode Read: read current mode 0-Manual 1-Auto |
| | | Value | [8–15] | zero | Reserved |
| | | | [16 . . . 31] | Calibrated | Signed 16 bit value range −32767 to +32767. Physical scale is 0.1 milliradians/bit. Physical range is −3276.7 to +3276.7 milliradians. |
| 710 714 718 (Read/Write) Non-Volitile | Auxillary_4 Auxillary_5 Auxillary_6 | Presence_Inq | 0 | 1 | Presence of this feature |
| | | | [1–5] | zero | Reserved |
| | | ON_OFF | 6 | 0 | Write: Switch this feature ON/OFF Read: read current mode |

-continued

Status and Control Registers for Mechanical Features

| Offset | Name | Field | Bit | Value | Description |
|---|---|---|---|---|---|
| | | A_M_Mode | 7 | 0 | 0-OFF 1-ON<br>Write: Set the Mode<br>Read: read current mode<br>0-Manual 1-Auto |
| | | | [8–31] | 0 | Value |
| 71C<br>720<br>(Read/<br>Write Non-<br>Volitile) | Temp_Comp_x<br>Temp_Comp_y | Presence<br>Inq | 0 | 1 | Presence of this feature |
| | | | (1 ... 5) | zero | Reserved |
| | | ON_OFF | 6 | 0 | Write: Switch this feature ON/OFF<br>Read: read current mode |
| | | A_M_Mode | 7 | 0 | 0-OFF 1-ON<br>Write: Set the Mode<br>Read: read current mode<br>0-Manual 1-Auto |
| | | | [8–31] | 0 | Value |

Although the present invention has been described with reference to preferred embodiments, workers skilled n the art will recognize that changes may be made in form and detail without departing from the spirit and scope of the invention.

What is claimed is:

1. An electronic assembly machine for performing an assembly operation on a workpiece, the machine comprising:
    a robotic system for performing the assembly operation based;
    a controller coupled to the robotic system and providing signals to the robotic system to cause the robotic system to perform the assembly operation;
    an image acquisition device coupled to the controller and disposed to acquire an image of the workpiece;
    wherein the image acquisition device is coupled to the controller through an interface operating in accordance with a Specification; and
    wherein the image acquisition device includes an illuminator that is controllable by the controller through the interface.

2. The machine of claim 1, wherein the illuminator is a darkfield illuminator.

3. The machine of claim 1, wherein the illuminator is a brightfield illuminator.

4. The machine of claim 1, wherein the controller monitors a number of energizations of the illuminator.

5. The machine of claim 1, wherein the image acquisition device includes a plurality of illuminators each controllable by the controller.

6. The machine of claim 1, wherein the image acquisition device includes characterization registers for providing information relating to capabilities of the image acquisition device.

7. The machine of claim 1, and further comprising storage for a parameter related to the image acquisition system.

8. The machine of claim 7, wherein the parameter is an optical parameter.

9. The machine of claim 7 wherein the parameter is a mechanical parameter.

10. The machine of claim 1, wherein the image acquisition device includes a board align camera.

11. The machine of claim 1, wherein an additional image acquisition device is coupled to the controller through the interface.

* * * * *